US007831891B2

(12) United States Patent
Han et al.

(10) Patent No.: US 7,831,891 B2
(45) Date of Patent: Nov. 9, 2010

(54) METHOD OF CHANNEL CODING FOR DIGITAL COMMUNICATION SYSTEM AND CHANNEL CODING DEVICE USING THE SAME

(75) Inventors: Sang-Min Han, Hwaseong-si (KR); Mi-Hyun Son, Seoul (KR); Kwy Ro Lee, Daejeon (KR); Seong Soo Lee, Suwon-si (KR); Dae Sik Park, Daejeon (KR); Young Hwan Kim, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1136 days.

(21) Appl. No.: 11/495,765

(22) Filed: Jul. 31, 2006

(65) Prior Publication Data

US 2007/0171989 A1  Jul. 26, 2007

(30) Foreign Application Priority Data

Jan. 24, 2006  (KR) ...................... 10-2006-0007342

(51) Int. Cl.
 *H03M 13/00* (2006.01)
(52) U.S. Cl. ..................................... 714/777
(58) Field of Classification Search ................. 714/777, 714/786; 704/222; 375/262
 See application file for complete search history.

(56) References Cited

U.S. PATENT DOCUMENTS 5,142,534 A * 8/1992 Simpson et al. ............. 370/330
6,347,122 B1 * 2/2002 Chen et al. .................. 375/262
7,310,597 B2 * 12/2007 Chamberlain ............... 704/222

FOREIGN PATENT DOCUMENTS

KR  10-1999-0067841 A  8/1999
KR  10-2000-0067966 A  11/2000

OTHER PUBLICATIONS

Victor K. Wei, "Generalized Hamming Weights for Linear Codes", IEEE Transactions on Information Theory, vol. 37, No. 5, Sep. 1991.
Taricco, G., et al., "Pragmatic Unequal Error Protection Coded Schemes for Satellite Communications," IEEE 1996 p. 1-5.

* cited by examiner

*Primary Examiner*—Sam Rizk
(74) *Attorney, Agent, or Firm*—Sughrue Mion, PLLC

(57) ABSTRACT

A method of channel coding a digital communication system and a device using the same is provided. The method includes quantizing analog data to digital data, the digital data corresponding to a predetermined number of digital codes; allocating channel codes to the digital codes, as a Hamming distance between a pair of channel codes corresponding to any pair of the digital codes is proportional to a difference between analog values of the pair of the digital codes; and channel coding the digital data by using the channel codes which are allocated to the digital codes to generate channel coded digital data. Accordingly, digital data, such as multimedia digital data without source coding and the like, of which information significance is different may be effectively transmitted and received.

12 Claims, 3 Drawing Sheets

METHOD OF CHANNEL CODING FOR DIGITAL COMMUNICATION SYSTEM AND CHANNEL CODING DEVICE USING THE SAME

CROSS-REFERENCE TO RELATED APPLICATION

This application claims priority from Korean patent application Ser. No. 10-2006-0007342, filed on Jan. 24, 2006, in the Korean Intellectual Property Office, the disclosure of which is incorporated herein by reference.

BACKGROUND OF THE INVENTION

1. Field of the Invention

The present invention relates to a digital communication method and device using the method, and more particularly to a method of channel coding in which a Hamming distance between a pair of channel codes appropriately changes and digital data without source coding is channel coded, and a channel coding device using the same.

2. Description of Related Art

When sending a parcel, a weight of a parcel should be as light as possible in order to reduce the shipping cost. In order to reduce the shipping cost of the parcel, eliminating extraneous contents of the parcel are required, and source coding in a digital communication is analogous to a process of eliminating extraneous contents in sending a parcel. Once extraneous contents are eliminated in a parcel to be sent, a proper package for the parcel is required in order to protect the parcel from rough handling and damage. Similarly, channel coding in a digital communication is analogous to a process of properly packaging the parcel to be sent. However, channel coding is slightly different from sending a parcel in proper packaging to protect contents from damage in that, even though data of contents may be destroyed during operation of channel coding, an error detection or an error correction may be possible in the digital communication.

Channel coding in a digital communication is a method of adding data to the original data in the data transmission, so that error caused by noise in a channel may be detected and corrected by a receiver, and the channel coding is called ECC (error control coding). In ordinary channel coding, an ability for error detection or error correction is acquired by adding some bits to the original data which is generally said to be a message. The primary concern in channel coding is recovering from an inevitable error occurring in a channel by adding a few bits.

Normally, when channel coding, a channel space is created to have a similar Hamming distance between a pair of channel codes. In this instance, a Hamming distance corresponds to a number of different bits. As an example, a Hamming distance between "00100101" and "00000000" is three and a Hamming distance "11111111" and "00000000" is eight.

Since a wireless ear set utilized for transmitting and receiving multimedia data, such as music and the like, should be lightweight and easy to carry, a source decoder having a complex configuration may not be equipped in a wireless ear set. Accordingly when multimedia data is transmitted and received in a wireless ear set, a source coding is not normally utilized. Namely, since a wireless ear set transmits multimedia data without source coding, source decoding may not be required for a wireless ear set of receiver, and a complicated source decoder may not be required. In digital data which has not been channel coded, information significance per bit may differ, such as an MSB (Most Significant Bit) and an LSB (Least Significant Bit). That is, in digital data which has not been channel coded, even if there is the same bit '1', one '1' bit may correspond to a larger analog value and another '1' bit may correspond to a smaller analog value.

As described above, when a general method of channel coding is utilized while channel coding digital data which have an MSB and an LSB, Hamming distances between a pair of the channel codes may be very similar, so that, despite significance of a corresponding bit, a bit error occurs during a transmitting operation via a channel.

Accordingly, when digital wireless communication in which source coding is omitted is executed (e.g., such as when transmitting multimedia data via a wireless ear set) in channel coding, since each bit is important, a new method of channel coding which can reduce a bit error rate and a new device of channel coding is earnestly required.

BRIEF SUMMARY OF EXEMPLARY EMBODIMENTS OF THE PRESENT INVENTION

The present invention provides a method of channel coding, for channel coding digital data without a source coding and a device using the channel coding method. According to an exemplary embodiment of the present invention, a Hamming distance between a pair of channel codes properly changes, and a bit error rate for an important bit becomes relatively low.

Exemplary embodiments of the present invention also provide a method of channel coding for channel coding digital data without a source coding, as a Hamming distance between a pair of the channel codes corresponding to any pair of the digital codes is proportional to a difference between analog values of the pair of the digital codes, so that an analog signal, closest to a receiving signal, is recovered.

Exemplary embodiments of the present invention also provide a method of channel coding for improving sound quality of a wireless ear set which transmits and receives multimedia data.

According to an aspect of the present invention, there is provided a method of channel coding, the method including: quantizing analog data to digital data, the digital data corresponding to a predetermined number of digital codes; allocating channel codes to the digital codes, as a Hamming distance between a pair of channel codes corresponding to any pair of the digital codes is proportional to a difference between analog values of the pair of the digital codes; and channel coding the digital data by using the channel codes which are allocated to the digital codes to generate channel coded digital data.

According to another aspect of the present invention, there is provided a method of digital communication, the method including: quantizing analog data to digital data, the digital data corresponding to a predetermined number of digital codes; allocating channel codes to the digital codes, as a Hamming distance between a pair of channel codes corresponding to any pair of the digital codes is proportional to a difference between analog values of the pair of the digital codes; channel coding the digital data by using the channel codes which are allocated to the digital codes to generate channel coded digital data; receiving the channel coded digital data, which is received via a channel and channel decoding the channel coded digital data to recover the digital data; and digital-analog converting the recovered digital data to recover the analog data.

According to still another aspect of the present invention, there is provided a method of channel coding, the method including: quantizing analog data to digital data, the digital data corresponding to a predetermined number of digital codes; allocating the channel codes to the digital codes so that a bit error rate of the digital code corresponding to an MSB (Most Significant Bit) becomes lower in comparison to a bit error rate of the digital code corresponding to an LSB (Least Significant Bit); and channel coding the digital data by using the channel codes which are allocated to the digital codes to generate channel coded digital data.

According to yet another aspect of the present invention, there is provided a device for channel coding including: a waveform coding unit converting a predetermined number of digital codes into corresponding digital data by quantizing an analog data; a channel coding unit creating the channel coded digital data by channel coding the digital data, as a Hamming distance between a pair of channel codes corresponding to any pair of the digital codes is proportional to a difference between analog values of the pair of the digital codes; and a digital data unit channel coding the digital data by using the channel codes that are allocated to the digital codes to generate channel coded digital data.

In an exemplary embodiment, analog data is multimedia data including audio data.

In an exemplary embodiment, multimedia data is at least one of audio data, video data, sensor measuring data, audio data and mixed data of video data and sensor measuring data.

In an exemplary embodiment, the method of channel coding, digital communication and the device of channel coding are utilized for a short distance transmission of the multimedia data via a wireless ear set.

BRIEF DESCRIPTION OF THE DRAWINGS

The above and/or other aspects of the present invention will become apparent and more readily appreciated from the following detailed description, taken in conjunction with the accompanying drawings of which.

DETAILED DESCRIPTION OF THE EXEMPLARY EMBODIMENTS

Figure 1:
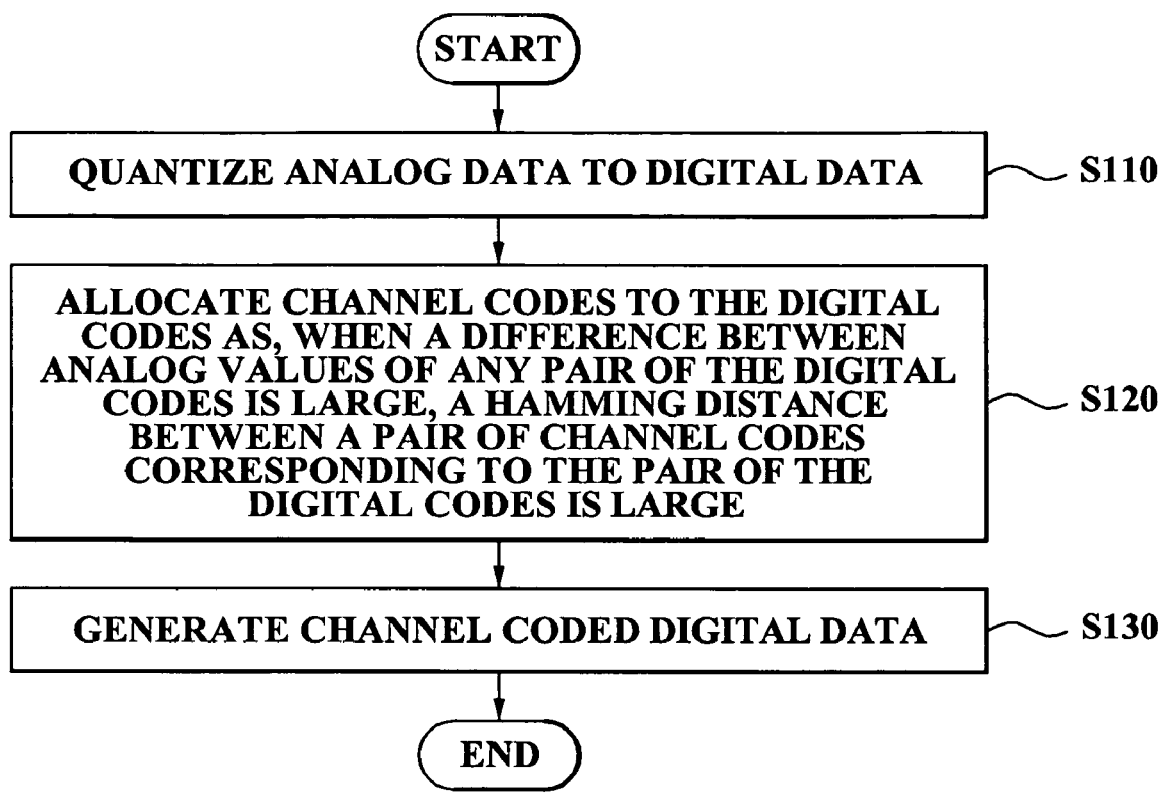
FIG. 1 is a flowchart illustrating a method of channel coding according to an exemplary embodiment of the present invention.

Reference will now be made in detail to exemplary embodiments of the present invention, examples of which are illustrated in the accompanying drawings, wherein like reference numerals refer to the like elements throughout. The exemplary embodiments are described below in order to explain the present invention by referring to the figures.

FIG. 1 is a flowchart illustrating a method of channel coding according to an exemplary embodiment of the present invention;

Referring to FIG. 1, in operation S110, a method of channel coding, according to an exemplary embodiment of the present invention, includes quantizing analog data to digital data, the digital data corresponding to a predetermined number of digital codes.

In this instance, in the operation S110, since an analog wave form is real data processed as itself, the operation S110 may be called waveform coding. In this instance, a pair of digital codes corresponds to a predetermined analog value.

As an example, when analog data continuously changes from −4 V to 3 V and is quantized, digital codes may respectively correspond to −4 V, −3 V, −2 V, −1 V, 0 V, 1 V, 2 V and 3 V, so that each digital code may be indicated as three bits. Namely, a digital code "011" may correspond to 3 V, a digital code "010" may correspond to 2 V, a digital code "001" may correspond to 1 V, a digital code "000" may correspond to 0 V, a digital code "111" may correspond to −1 V, a digital code "110" may correspond to −2 V, a digital code "101" may correspond to −3 V and a digital code "100" may correspond to −4 V.

Also, in operation S120, in a method of channel coding, the method includes allocating channel codes to the digital codes, as a Hamming distance between a pair of channel codes corresponding to any pair of the digital codes is proportional to a difference between analog values of the pair of the digital codes.

In this instance, a Hamming distance corresponds to a number of different bits. As an example, a Hamming distance between "00100101" and "00000000" is three, a Hamming distance between "11111111" and "00000000" is eight. That is, channel codes are allocated to the digital codes as, a Hamming distance between a channel code corresponding to an analog value −1 V and a channel code corresponding to an analog value −2 V is smaller than a Hamming distance between a channel code corresponding to an analog value −1 V and a channel code corresponding to an analog value −3 V. Even if a Hamming distance between a channel code corresponding to an analog value of 1 V and a channel code corresponding to an analog value of −2 V and a Hamming distance between a channel code corresponding to an analog value of 0 V and a channel code corresponding to an analog value of −2 V is the same, overall Hamming distances between a pair of channel codes corresponding to the pair of the digital codes tend to become larger, which may be a characteristic included in a technique of the present invention.

Since digital codes are directly channel coded without source coding, digital codes may correspond to a predetermined analog value. Accordingly, as a difference of an analog value between any pair of the digital codes become large, a Hamming distance between a pair of channel codes corresponding to the pair of the digital codes may become large, consequently an error occurring during transmitting and receiving operations can be effectively reduced. Namely, even if noise interferes with transmitted data via a channel and bit error occurs, the possibility of being mistaken as a code which has a smaller analog value is higher than the possibility of being mistaken as a code which has a bigger analog value, therefore bit error may be effectively reduced.

On the other hand, the operation S120 includes allocating the channel codes to the digital codes, where a bit error rate of the digital code to the MSB is lower than a bit error rate of the digital code to the LSB. Namely, the error occurrence rate in a bit which corresponds to a higher analog value is supposed to become lower than the error occurrence rate in a bit which corresponds to a smaller analog value, therefore a difference between transmitting and receiving signals can be minimized when a bit error occurs.

Also, in operation S130, an exemplary embodiment of the present invention includes channel coding the digital data by using the channel codes which are allocated to the digital codes to generate channel coded digital data.

TABLE 1

| | DIGITAL CODE | | CHANNEL CODE | | |
|---|---|---|---|---|---|
| ANALOG VALUE | 2 | 1 | 3 | 2 | 1 |
| 1 | 0 | 1 | 0 | 0 | 0 |
| 0 | 0 | 0 | 0 | 1 | 0 |
| −1 | 1 | 1 | 1 | 0 | 0 |
| −2 | 1 | 0 | 1 | 1 | 1 |

TABLE 2

| | DIGITAL CODE | | CHANNEL CODE | | |
|---|---|---|---|---|---|
| ANALOG VALUE | 2 | 1 | 3 | 2 | 1 |
| 1 | 0 | 1 | 0 | 0 | 1 |
| 0 | 0 | 0 | 1 | 0 | 0 |
| −1 | 1 | 1 | 1 | 1 | 1 |
| −2 | 1 | 0 | 0 | 1 | 0 |

TABLE 3

| | DIGITAL CODE | | CHANNEL CODE | | |
|---|---|---|---|---|---|
| ANALOG VALUE | 2 | 1 | 3 | 2 | 1 |
| 1 | 0 | 1 | 1 | 1 | 1 |
| 0 | 0 | 0 | 1 | 1 | 0 |
| −1 | 1 | 1 | 1 | 0 | 0 |
| −2 | 1 | 0 | 0 | 0 | 0 |

Table 1, above, indicates channel codes that are allocated regardless of differences of analog value of digital codes, Table 2, above, indicates channel codes that are allocated to a parity check and Table 3, above, indicates channel codes that are allocated, as a Hamming distance between a pair of channel codes corresponding to any pair of the digital codes is proportional to a difference between analog values of the pair of the digital codes.

Table 4 through Table 6, below, indicate a Hamming distance between analog values of Table 1 through Table 3, respectively.

TABLE 4

| ANALOG VALUE | 1 | 0 | −1 | −2 |
|---|---|---|---|---|
| 1 | 0 | 1 | 1 | 3 |
| 0 | 1 | 0 | 2 | 2 |
| −1 | 1 | 2 | 0 | 2 |
| −2 | 3 | 2 | 2 | 0 |

TABLE 5

| ANALOG VALUE | 1 | 0 | −1 | −2 |
|---|---|---|---|---|
| 1 | 0 | 2 | 2 | 2 |
| 0 | 2 | 0 | 2 | 2 |
| −1 | 2 | 2 | 0 | 2 |
| −2 | 2 | 2 | 2 | 0 |

TABLE 6

| ANALOG VALUE | 1 | 0 | −1 | −2 |
|---|---|---|---|---|
| 1 | 0 | 1 | 2 | 3 |
| 0 | 1 | 0 | 1 | 2 |
| −1 | 2 | 1 | 0 | 1 |
| −2 | 3 | 2 | 1 | 0 |

As an example, in Table 6, Hamming distances corresponding to the same rows and columns that have a same analog value are zero since corresponding channel codes are the same. As an example, in Table 6, channel codes corresponding to the analog value of 0 and 1 respectively indicates "110" and "111", therefore a Hamming distance between "110" and "111" is one, similar to channel codes of a Table 3. As an example, in Table 6, each channel code corresponding to an analog value of −1 and 1, respectively indicates "100" and "111", therefore a Hamming distance between "100" and "111" is 2, similar to channel codes of a Table 3.

As illustrated in a Table 5, according to a general method of channel coding, Hamming distances between a pair of channel codes are supposed to be similar or the same. Namely, Hamming distances between a pair of channel codes are required to be regular in order to effectively correct an error under a condition of a predetermine bandwidth.

However, in channel coding digital data without source coding, each digital code which is supposed to be channel coded has an MSB and an LSB, and respectively corresponds to a predetermined analog value. Accordingly, in this instance, even if an error occurs, channel codes should be set up in order to be recognized as a code corresponding to a relatively close analog value, therefore damage caused by an error during the operations of transmitting and receiving may be minimized.

When a Hamming distance is one and a one bit error occurs, the error may not be corrected, when a Hamming distance is two and a one bit error occurs, there is a fifty percent chance that a correct digital code will be recovered and a fifty percent chance that a wrong digital code may be recovered, and when a Hamming distance is more than 3 and a one bit error occurs, an accurate error correction is possible by correcting an occurred error.

Accordingly, when a channel code is allocated regardless of a difference between a pair of analog values of digital codes as illustrated in Table 1 and Table 4, an estimated value of the difference between the pair of analog values when one bit error occurs is calculated as shown below.

An estimated value corresponding to when a Hamming distance is 1+ an estimated value corresponding to when a Hamming distance is 2=2{(1+4)+0.5(1+4)}=16.

In this instance, the '1' in the first pair of parentheses corresponds to a square of 1 which is a difference between the analog values 1 and 0, a '4' in the first pair of parentheses corresponds to a square of 2 which is a difference between analog values 1 and −1. Also, two '1's in the second pair of parentheses respectively correspond to a square of 1 which is a difference between analog values 0 and −1 and a difference between analog values −1 and −2.

Next, in Table 2 and Table 5 where channel codes corresponding to digital codes are allocated to a parity check code, when one bit error occurs, an estimated value of analog value differences may be calculated as shown below.

An estimated value corresponding to when a Hamming distance is 2=2{0.5(1+4+9+1+4+1)}=20.

In this instance, three '1's in the parentheses respectively correspond to a square of 1 which is a difference between analog values 1 and 0, a square of 1 which is a difference between analog values 0 and −1, a square of 1 which is a difference between analog values −1 and −2. Also, two '4's in the parentheses respectively correspond to a square of 2 which is a difference between analog values 1 and −1, a square of 2 which is a difference between analog values 0 and −2, and the '9' in the parentheses corresponds to a square of 3 which is a difference between analog values 1 and −2.

Next, according to an exemplary embodiment of the present invention, in Table 3 and Table 6, in which a Hamming distance between a pair of channel codes corresponding to any pair of digital codes is proportional to a difference between analog values of the pair of the digital codes, when one bit error occurs, an estimated value of a difference between analog values may be calculated as shown below.

An estimated value corresponding to a Hamming distance is 1+an estimated value corresponding to when a Hamming distance is $2=2\{(1+1+1)+0.5(4+4)\}=14$.

In this instance, the three '1's in the first pair of parentheses correspond to a square of 1 which is a difference between analog values 1 and 0 and a difference between analog values −1 and −2, the two '4's in the second pair of parentheses respectively correspond to a square of 2 which is a difference between analog values 1 and −1 and a difference between analog values 0 and −2.

As described above, when to a Hamming distance between a pair of channel codes corresponding to any pair of the digital codes is proportional to a difference between analog values of the pair of digital codes, and when a bit error occurs, a difference between a recovered analog value and a transmitted analog value may be effectively reduced, therefore transmitting and receiving data may be effectively executed. Namely, as a Hamming distance between a pair of channel codes corresponding to any pair of the digital codes is proportional to a difference between analog values of the pair of digital codes, therefore a bit error rate of the digital code of an MSB is lower than a bit error rate of the digital code of a LSB, and consequently a significance of damage caused by bit error may be minimized.

Particularly, such as in multimedia data, an analog value which is transmitted and received but is not one hundred percent perfectly recovered is no longer a primary concern because, according to the present invention, despite an error which may occur in the operations of data transmitting and receiving, an analog value may be recovered to be a relatively close analog value such that the receiving signal is relatively accurate, therefore degradation of a sound quality and an image quality caused by a bit error occurrence via a digital channel, may be reduced.

A method of channel coding illustrated in FIG. 1 may be effectively applicable to a short distance transmission of multimedia data via a wireless ear set without source coding.

Figure 2:
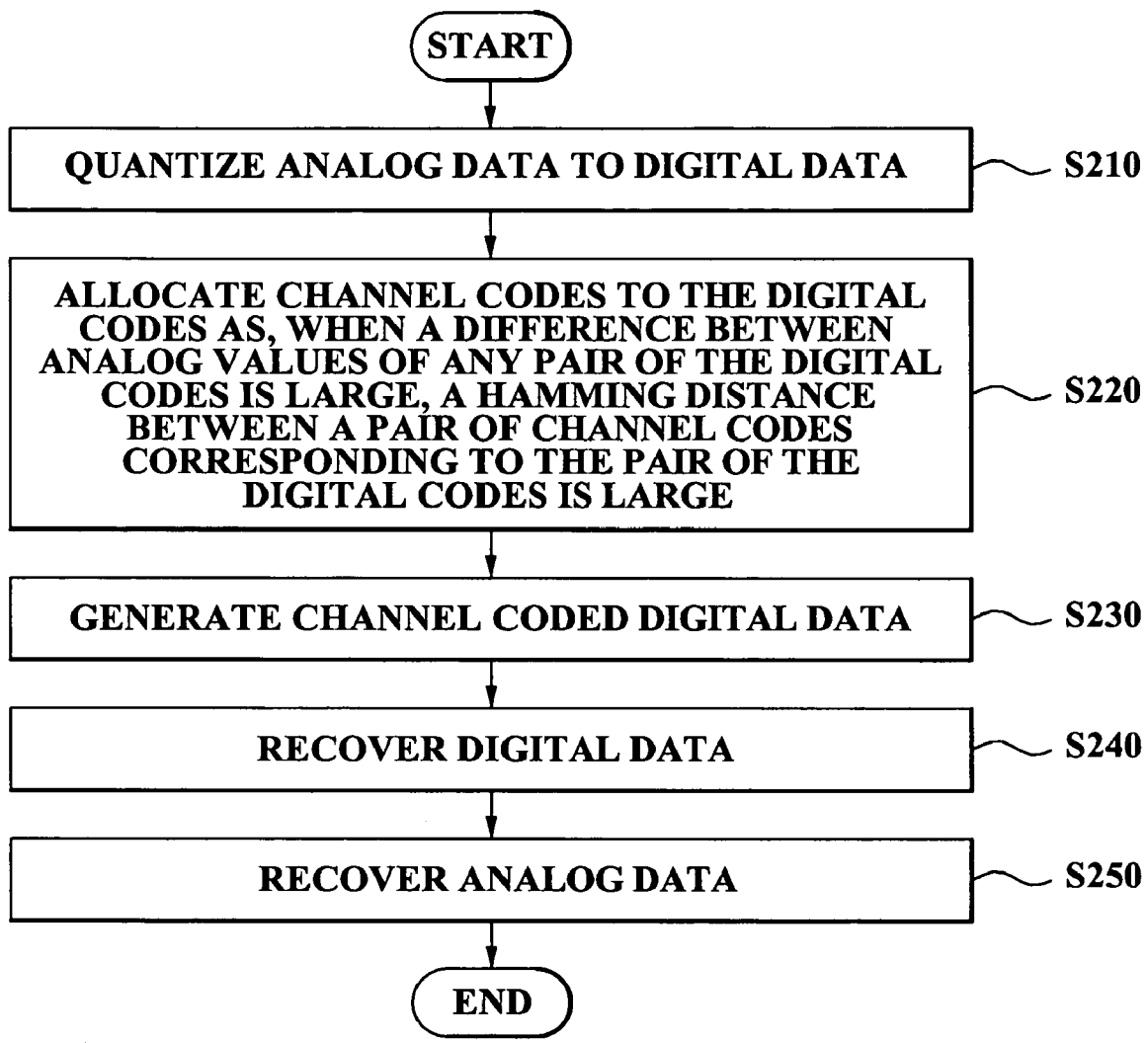
FIG. 2 is a flowchart illustrating a method of digital communication according to an exemplary embodiment of the present invention.

FIG. 2 is a flowchart illustrating a method of a digital communication according to an exemplary embodiment of the present invention. Referring to FIG. 2, a method of a digital communication according to another exemplary embodiment of the present invention shows operation S210 includes quantizing analog data to digital data, the digital data corresponding to a predetermined number of digital codes. In this instance, in operation S210, since an analog wave form is real data processed as itself, the operation of S210 may be called a waveform coding. Also, in operation S220, a method of a digital communication includes allocating channel codes to the digital codes, as a Hamming distance between a pair of channel codes corresponding to any pair of the digital codes is proportional to a difference between analog values of the pair of the digital codes.

As an example, channel codes are allocated to digital codes, so that a Hamming distance between a channel code corresponding to an analog value −1 V and a channel code corresponding to an analog value −2 V is smaller than a Hamming distance between a channel code corresponding to an analog value −1 V and a channel code corresponding to an analog value −3 V. Even if a Hamming distance between a channel code corresponding to an analog value of 1V and a channel code corresponding to an analog value of −2V and a Hamming distance between a channel code corresponding to an analog value of 0V and a channel code corresponding to an analog value of −2V is the same, overall Hamming distances between a pair of channel codes corresponding to the pair of the digital codes tend to become larger, which may be a characteristic included in a technique of the present invention.

Also, in operation of S230, a method of a digital communication includes channel coding the digital data by using the channel codes which are allocated to the digital codes to generate channel coded digital data.

Detailed descriptions of the above described operation of S210, S220 and S230 are the same as the exemplary embodiments described with FIG. 1.

Also, in operation of S240, a method of a digital communication according to an exemplary embodiment of the present invention includes receiving the channel coded digital data which is received via a channel and channel decoding the channel coded digital data to recover the digital data, and digital-analog converting the recovered digital data to recovering the analog data.

In this instance, a digital data and a noise may be mixed with a transmitted signal via a channel, so that a bit error is caused by the noise. BER (Bit Error Rate) in which a bit error occurs may vary depending upon channel conditions.

Also, in operation of S250, a method of a digital communication according to an exemplary embodiment of the present invention includes digital-analog converting the recovered digital data to recovering the analog data.

In this instance, since recovered analog data may recover relatively close analog data when a bit error occurs during operation of data transmitting and receiving, an effect caused by a bit error occurrence during operation of data transmitting and receiving is reduced.

Figure 3:
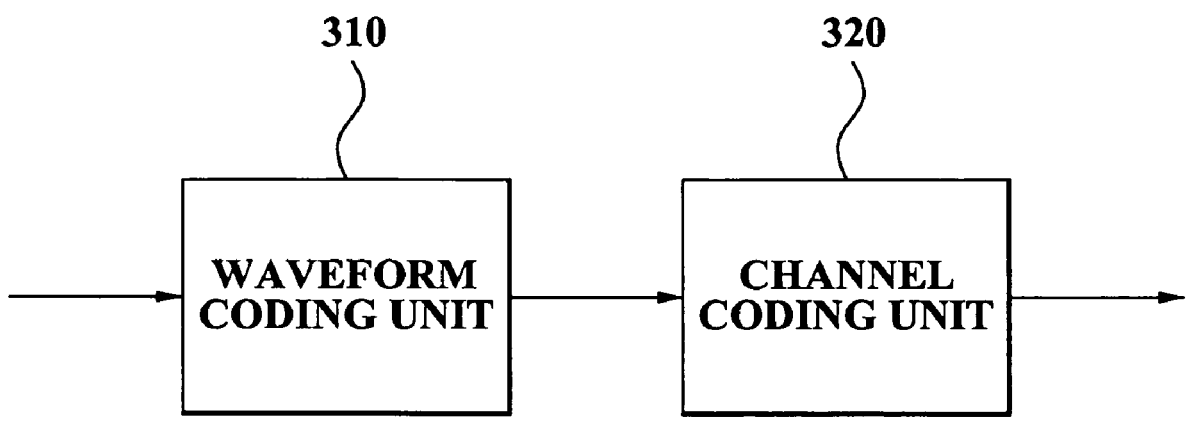
FIG. 3 is a block diagram illustrating a device of channel coding according to an exemplary embodiment of the present invention.

FIG. 3 is a block diagram illustrating a device of channel coding according to an exemplary embodiment of the present invention. Referring to FIG. 3, a device of channel coding according to an exemplary embodiment of the present invention includes a waveform coding unit 310 and a channel coding unit 320.

The waveform coding unit 310 quantizes analog data to digital data, the digital data corresponding to a predetermined number of digital codes.

The channel coding unit 320 includes allocating channel codes to the digital codes, as a Hamming distance between a pair of channel codes corresponding to any pair of digital codes is proportional to a difference between analog values of the pair of the digital codes.

As an example, when analog data continuously changes from −4 V to 3 V is quantized, digital codes may respectively correspond to −4 V, −3 V, −2 V, −1 V, 0 V, 1 V, 2 V and 3 V, so that each digital code may be indicated as three bits. Namely, a digital code "011" may correspond to 3 V, a digital code "010" may correspond to 2 V, a digital code "001" may correspond to 1 V, a digital code "000" may correspond to 0 V, a digital code "111" may correspond to −1 V, a digital code "110" may correspond to −2 V, a digital code "101" may correspond to −3 V and a digital code "100" may correspond to −4 V.

A method of channel coding and a digital communication according to the present invention includes a program instruction for executing various operations realized by a computer. The computer readable medium may include a program instruction, a data file, and a data structure, separately or cooperatively. The program instructions and the media may be those specially designed and constructed for the purposes of the present invention, or they may be of the kind well known and available to those skilled in the art of computer software arts. Examples of the computer readable media include magnetic media (e.g., hard disks, floppy disks, and magnetic tapes), optical media (e.g., CD-ROMs or DVD), magneto-optical media (e.g., floptical disks), and hardware devices (e.g., ROMs, RAMs, or flash memories, etc.) that are specially configured to store and perform program instructions. The media may also be transmission media such as optical or metallic lines, wave guides, etc. including a carrier wave transmitting signals specifying the program instructions, data structures, etc. Examples of the program instructions include both machine code, such as produced by a compiler, and files containing high-level language codes that may be executed by the computer using an interpreter. The hardware elements above may be configured to act as one or more software modules for implementing the operations of this invention.

A method of channel coding and a device of channel coding using the method of the present invention, in which channel coding digital data without source coding, is provided. When a Hamming distance between a pair of channel codes is appropriately changed, a bit error of an important bit may become comparatively low.

Also, the present invention provides channel coding digital data without source coding, as a Hamming distance between a pair of channel codes corresponding to any pair of the digital codes is proportional to a difference between analog values of the pair of the digital codes, and therefore a closest analog signal to a transmission signal may be recovered when a bit error occurs.

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. A method of channel coding comprising:
   quantizing analog data to digital data, the digital data corresponding to a predetermined number of digital codes;
   allocating channel codes to the digital codes so that a Hamming distance between a pair of the channel codes corresponding to any pair of the digital codes is proportional to a difference between analog values of the pair of the digital codes; and
   channel coding the digital data by using the channel codes which are allocated to the digital codes to generate channel coded digital data.

2. The method of claim 1, wherein the analog data is at least one of multimedia data including audio data and sensor measuring data.

3. The method of claim 2, wherein the method of channel coding is utilized for a short distance transmission of the multimedia data via a wireless earset.

4. A non-transitory computer readable storage medium storing a program for implementing the method of claim 1.

5. A digital communication method comprising:
   quantizing analog data to digital data, the digital data corresponding to a predetermined number of digital codes;
   allocating channel codes to the digital codes so that a Hamming distance between a pair of channel codes corresponding to any pair of the digital codes is proportional to a difference between analog values of the pair of the digital codes;
   channel coding the digital data by using the channel codes which are allocated to the digital codes to generate channel coded digital data;
   receiving the channel coded digital data, received via a channel, and channel decoding the channel coded digital data to recover the digital data; and
   digital-to-analog converting the recovered digital data to recover the analog data.

6. The method of claim 5, wherein the analog data comprises multimedia data including audio data.

7. The method of claim 6, wherein the digital communication method is utilized for a short distance transmission of the multimedia data via a wireless earset.

8. A channel coding method comprising:
   quantizing analog data to digital data, the digital data corresponding to a predetermined number of digital codes;
   allocating channel codes to the digital codes so that a first bit error rate of a first digital code corresponding to an MSB (Most Significant Bit) becomes lower than a second bit error rate of a second digital code corresponding to an LSB (Least Significant Bit); and
   channel coding the digital data by using the channel codes which are allocated to the digital codes to generate channel coded digital data.

9. A non-transitory computer readable storage medium storing a program for implementing the method of claim 8.

10. A device for channel coding comprising:
    a waveform coding unit which converts a predetermined number of digital codes into corresponding digital data by quantizing analog data;
    a channel coding unit which creates channel coded digital data by channel coding the digital data so that a Hamming distance between a pair of channel codes corresponding to any pair of the digital codes is proportional to a difference between analog values of the pair of the digital codes; and
    a digital data unit channel which codes the digital data by using the channel codes that are allocated to the digital codes to generate channel coded digital data.

11. The device of claim 10, wherein the analog data is multimedia data including audio data.

12. The device of claim 11, wherein the channel coding device is utilized for a short distance transmission of the multimedia data via a wireless earset.

* * * * *